United States Patent
Carey et al.

(10) Patent No.: US 7,847,253 B2
(45) Date of Patent: Dec. 7, 2010

(54) WIDEBAND SEMICONDUCTING LIGHT DETECTOR

(75) Inventors: James E. Carey, Waltham, MA (US); Nathaniel J. McCaffrey, Hampton Falls, NH (US); Martin U. Pralle, Wayland, MA (US)

(73) Assignee: SiOnyx, Inc., Beverly, MA (US)

( * ) Notice: Subject to any disclaimer, the term of this patent is extended or adjusted under 35 U.S.C. 154(b) by 113 days.

(21) Appl. No.: 12/252,101

(22) Filed: Oct. 15, 2008

(65) Prior Publication Data

US 2010/0038542 A1 Feb. 18, 2010

Related U.S. Application Data

(60) Provisional application No. 61/089,368, filed on Aug. 15, 2008.

(51) Int. Cl.
*G01J 5/00* (2006.01)
(52) U.S. Cl. .................................................. 250/338.3
(58) Field of Classification Search .... 250/338.1–338.5
See application file for complete search history.

(56) References Cited

U.S. PATENT DOCUMENTS

| | | | |
|---|---|---|---|
| 4,201,450 A | 5/1980 | Trapani | |
| 4,277,793 A | 7/1981 | Webb | |
| 4,965,784 A | 10/1990 | Land et al. | |
| 5,640,013 A | 6/1997 | Ishikawa et al. | |
| 5,773,820 A | 6/1998 | Osajda et al. | |
| 5,977,603 A | 11/1999 | Ishikawa | |
| 6,080,988 A | 6/2000 | Ishizuya et al. | |
| 6,420,706 B1 * | 7/2002 | Lurie et al. | 250/338.1 |
| 6,825,057 B1 | 11/2004 | Heyers et al. | |
| 7,057,256 B2 | 6/2006 | Carey, III et al. | |
| 7,354,792 B2 | 4/2008 | Carey, III et al. | |
| 7,390,689 B2 | 6/2008 | Mazur et al. | |
| 7,442,629 B2 | 10/2008 | Mazur et al. | |
| 2002/0148964 A1 * | 10/2002 | Dausch et al. | 250/338.3 |
| 2003/0029495 A1 | 2/2003 | Mazur et al. | |
| 2006/0231914 A1 | 10/2006 | Carey, III et al. | |
| 2008/0258604 A1 | 10/2008 | Mazur et al. | |

FOREIGN PATENT DOCUMENTS

| | | |
|---|---|---|
| EP | 0566156 A1 | 10/1993 |
| JP | 2007-180643 A | 7/2007 |

(Continued)

OTHER PUBLICATIONS

Wu et al., "Near-unity below-band-gap absorption by microstructured silicon," 2001, Applied Physics Letters, vol. 78, No. 13, pp. 1850-1852.*

(Continued)

*Primary Examiner*—David P Porta
*Assistant Examiner*—Kiho Kim
(74) *Attorney, Agent, or Firm*—Pepper Hamilton LLP (57) ABSTRACT

A detector incorporating a laser-doped element that is favorably absorbing to at least a portion of the electromagnetic spectrum, for example in the infra-red range, is used in a light detector article. Readout circuits permitting a detector to operate in a substantial range of the electromagnetic spectrum, including the visual and infra-red range, enable day and night imaging in some embodiments. Configurations for making the detectors are also provided.

7 Claims, 11 Drawing Sheets

FOREIGN PATENT DOCUMENTS

WO 2008091242 A2 7/2008

OTHER PUBLICATIONS

Carey, et al., "Fabrication of Micrometer-Sized Conical Field Emitters Using Femtosecond Laser-Assisted Etching of Silicon," Proc. IVMC 2001, 75-76, UC Davis, Davis, CA.

Carey, et al., "Field Emission from Silicon. Microstructures Formed by Femtosecond Laser Assisted Etching," Proc. CLEO 2001 (Baltimore, MD 2001) 555-557.

Carey, et al. "Femtosecond Laser-Assisted Microstructuring of Silicon for Novel Detector, Sensing and Display Technologies", LEOS 2002, 97-98, Glasgow, Scotland.

Carey, et al., "High Sensitivity Silicon-Based VIS/NIR Photodetectors", Optical Society of America (2003) 1-2.

Carey, et al. "Femtosecond Laser-Assisted Microstructuring of Silicon for Novel Detector, Sensing and Display Technologies", LEOS 2003, 481-482, Tuscon, AR.

Carey et al., "Femtosecond-Laser-Assisted Microstructuring of Silicon Surfaces", Optics and Photonics News, 2003. 14, 32-36.

Crouch et al., "Infrared Absorption by Sulfur-Doped Silicon Formed by Femtosecond Laser Irradiation", Appl. Phys. A, 2004, 79, 1635-1641.

Crouch et al., "Comparison of Structure and Properties of Femtosecond and Nanosecond Laser-Structured Silicon" Appl. Phys. Lett., 2004, 84,1850-1852.

Dolgaev et al., "Formation of Conical Microstructures Upon Laser Evaporation of Solids", Appl. Phys. A, 2001, 73, 177-181.

Fowlkes et al., "Surface Microstructuring and Long-Range Ordering of Silicon Nanoparticles", Appl. Phys. Lett., 2002, 80 (20), 3799-3801.

Her et al., "Novel Conical Microstructures Created in Silicon With Femtosecond Laser Pulses", CLEO 1998, 511-512, San Francisco, CA.

Her et al., "Microstructuring of Silicon with Femtosecond Laser Pulses," Applied Physics Letters, 1998, 1673-1675, vol. 73, No. 12, American Institute of Physics.

Her, et al., "Femtosecond laser-induced formation of spikes on silicon," Applied Physics A, 2000, 70, 383-385.

Hu et al., "Solar Cells from Basic to Advanced Systems," McGraw Hill Book Co., 1983, 39, New York, New York.

Pedraza et al., "Surface Nanostructuring of Silicon", Appl. Phys. A, 2003, 77, 277-284.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.

Sanchez et al., "Dynamics of the Hydrodynamical Growth of Columns on Silicon Exposed to ArF Excimer-Laser Irradiation", Appl. Phys. A, 1998, 66, 83-86.

Sanchez et al., "Whiskerlike Structure Growth on Silicon Exposed to ArF Excimer Laser Irradiation", Appl. Phys. Lett., 1996, 69 (5), 620-622.

Serpengüzel et al., "Temperature Dependence of Photluminescence in Non-Crystalline Silicon", Photonics West (San Jose, CA, 2004) 454-462.

Shen et al., "Formation of Regular Arrays of Silicon Micorspikes by Femotsecond Laser Irradiation Through a Mask", Appl. Phys. Lett., 82, 1715-1717 (2003).

Solar Energy Research Institute, "Basic Photovoltaic Principles and Methods," Van Nostrand Reinhold Co., NY 1984, pp. 45-47 and 138-142.

Wu et al., "Black Silicon: A New Light Absorber," APS Centennial Meeting (Mar. 23, 1999).

Wu et al., "Femtosecond laser-gas-solid interactions," Thesis presented to the Department of Physics at Harvard University, pp. 1-113, 126-136, Aug. 2000.

Wu et al., "Visible Luminescence From Silicon Surfaces Microstructured in Air". Appl. Phys. Lett., vol. 81, No. 11, 1999-2001 (2002).

Younkin, "Surface Studies and Microstructure Fabrication Using Femtosecond Laser Pulses," Thesis presented to the Division of Engineering & Applied sciences at Harvard University (Aug. 2001).

Younkin et al., "Infrared Absorption by Conical Silicon Microstructures Made in a Variety of Background Gases Using Femtosecond-Laser Pulses", J. Appl. Phys., 93, 2626-2629 (2003).

Bogue, "From Bolometers to Beetles: the Development of Thermal Imaging Sensors," Sensor Review, (2007) vol. 27, No. 4, 278-281, Emerald Group Publishing Limited, Bingley, United Kingdom.

Chien et al, "Pulse Width Effect in Ultrafast Laser Processing of Materials," Applied Physics A, 2005, 1257-1263, 81, Springer Berlin, Heidelberg, Germany.

Nayak et al, "Semiconductor Laesr Crystallization of a-Si:H," SPIE Digital Library, 2003, 277-380, vol. 4977, Bellingham, Washington.

Nayak et al, "Semiconductor Laser Crystallization of a-Si:H on Conducting Tin-Oxide-Coated Glass for Solar Cell and Display Applications," Applied Physics A, 2005, 1077-1080, 80, Springer Berlin, Heidelberg, Germany.

Nayak et al, "Ultrafast-Laser-Assisted Chemical Restructuring of Silicon and Germanium Surfaces," Applied Surface Science, 2007, 6580-6583, vol. 253, Issue 15, Elsevier B.V.

Nayak et al, "Ultrafast Laser Textured Silicon Solar Cells," Mater. Res. Soc. Symp. Proc., 2009, vol. 1123, Materials Research Society.

Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.

Moloney, A. M., et al, "Novel Black Silicon PIN Photodiodes," Semiconductor Photodetectors III, Proceedings of the SPIE, 2006, vol. 6119, 61190B-1-61190B-8, Bellingham, Washington.

Oden, P.I. et al, "Optical and Infrared Detection Using Microcantilevers," Infrared Technology and Applications XXII, Proceedings of the SPIE, 1996, vol. 2744, 345-254, Orlando, Florida.

Xu, Y., et al, "Infrared Detection Using Thermally Isolated Diode," Sensors and Actuators A, Elsevier Sequoia S.A., 1993, vol. 36, 209-217, Lausanne, Switzerland.

* cited by examiner

WIDEBAND SEMICONDUCTING LIGHT DETECTOR

I. RELATED APPLICATIONS

This application claims the benefit and priority under 35 U.S.C. §120 of U.S. Provisional Patent Application Ser. No. 61/089,368, filed on Aug. 15, 2008, which is hereby incorporated by reference.

II. BACKGROUND

The present disclosure relates to the detection of electromagnetic radiation, and more particularly, to methods and articles for detecting such radiation in a plurality of wavelengths including in the visible and in the infra-red wavelength ranges.

Imagers are useful in recording features of an electromagnetic field at a detector location and converting the recorded features into an image that can be stored or displayed for various purposes. In the example of every day cameras, imagers capture visible light incident upon a sensitive film or digital array. In analog film systems, the film is altered so as to capture a snapshot in time of the light to which it was exposed. In digital imaging systems, an array of light-sensitive pixels respond to an intensity of incident light at each pixel location, providing an electrical output representative of the incident light. The output of an imager can be referred to as an image.

Motion or video cameras repeat the process described above, but permit a time-sequence to be captured, for example at regular intervals, so that the captured images can be replayed to recreate a dynamic scene or sequence.

Most film and digital pixel imagers include wavelength-specific sensors or detectors. The chemical composition of the film or the design of the digital pixels and associated filters determines the range of wavelengths of light to which the film or pixels respond. Practically, a detector or imager has a frequency response that is optimized to provide images of light in the range of wavelengths the imager is designed for. The most common examples are sensitive to visible light (e.g., red, green, blue, and combinations thereof). Visible light corresponds to the range of wavelengths of electromagnetic radiation to which our eyes are sensitive, and is generally in the range of 400 to 750 nanometers (nm).

Special film and digital pixel imagers are designed for low-light operation to provide night vision capability for military, security, or other special applications in which an illumination source is not available to cause a visible light image. Low-light or night vision imagers rely on detecting and imaging frequencies below (wavelengths longer than) the visible (red) wavelengths, and are sometimes called infra-red (IR) detectors. IR detection is more suited for picking up heat emissions from objects such as a person's body or a vehicle. IR radiation itself can be roughly divided into sub-spectra including the near-infra-red (NIR) having wavelengths between about 750 to 110 nm, short-wave-infra-red (SWIR) having wavelengths between about 110 and 2500 nm, medium-wave-infra-red (MWIR) having wavelengths between about 2500 and 5500 nm, and long-wave-infra-red (LWIR) having wavelengths between about 8000 and 1200) nm. These ranges are defined somewhat arbitrarily, and are given merely for simplifying the following discussion, and those skilled in the art will appreciate the generality of the discussion as it relates to the bands of wavelengths of the electromagnetic spectrum.

Present visible light imaging cameras have used silicon devices made with CID, CCD, or CMOS APS architectures. The low cost and efficient collection of photons from 400-750 nm wavelengths has enabled silicon devices. Extending the use of silicon imagers into the near infrared (NIR) band requires a greater volume of material to detect these wavelengths because of silicon's relatively low absorption coefficient in this wavelength range. This increases the size of the detectors and causes increased leakage current and requires expensive manufacturing processes or higher voltages to operate. The use of thick silicon substrates also limits the ability to integrate other devices, and impedes the ability to place circuits under the detector.

SWIR remains mostly undetected by silicon (Si) detectors, which are transparent to this wavelength. The use of exotic detector materials such as indium gallium arsenide (InGaAs) or germanium (Ge) can solve some technical problems but creates others and increases the cost of the products.

With LWIR, direct detection is typically attempted with exotic materials such as HgCdTe cooled to cryogenic temperatures. This is not ideal as such cooled exotic detectors do not lend themselves for practical use in many applications.

A bolometer provides one way to detect electromagnetic radiation such as IR. A suspended or cantilevered member, e.g. in a micro electro-mechanical system (MEMS), responds to detected radiation by way of changes to its temperature which are measured electrically by changes in its resistance or physical dimension to indicate an intensity of the incident radiation. Bolometers can thus be used in arrays as pixels in an imaging system. Bolometers have been generally described in the art, including that cited in this application. The deficiencies outlined above with regard to detection of IR and broadband fight in traditional detector materials applies to bolometer designs, and thus even with bolometer detectors, present systems are inefficient and impractical over broad ranges of the IR spectrum, notably in or around the IR wavelengths.

Present low-light or night vision IR imagers are usually less sensitive than would be desired, lack color definition, and have limited frequency response. Also, low-light imagers can be more costly, noisy, and require greater circuit resources than visible light imagers to achieve useful gains in low-signal conditions. Furthermore, because long wavelength (IR) light penetrates common detector materials to a greater depth, IR detectors are larger than would be desired for compact portable applications. In summary, present IR detectors ate not economical and do not provide good quality imaging especially over a range of wavelengths that might be desired.

IV. SUMMARY

From the discussion given above it can be appreciated that better detectors capable of operating at least in the IR wavelength ranges are desirable. The following discussion provides such improved detection methods and apparatus, including methods and apparatus for detecting light in the IR ranges, and for detecting light over a plurality of wavelengths, for example in both an IR range and a visible range. Greater bandwidth detectors allow imaging in a variety of lighting conditions, for example in day and night. Embodiments hereof provide silicon-based imagers and detector elements capable of imaging across a range of electromagnetic wavelengths, including in various portions of the IR spectrum and in a wide range of lighting conditions. Additionally, the present embodiments illustrate compact, thin designs that offer increased sensitivity and resolution at a lower cost than presently available systems. Some embodiments hereof are constructed in the form of bolometers or microbolometers that are incorporated into a semiconductor-based MEMS detector array imager apparatus.

Applications of the present detectors and imagers are also provided where a single imaging product can be made to respond to normal day light as well as low-light or night time conditions. These applications are useful to allow operators to see and record images during a variety of conditions such as military combat, operation of a motor vehicle over terrain, operation of aircraft, gaming applications, medical application, and others.

Specific examples of applications of the present methods and apparatus include systems for targeting during normal and low-light conditions without needing to replace one (daylight) system with another (low-light) system or vice versa. For instance, as used in a rifle scope and sighting article that allows a user to sight and target an object or person, during daytime, nighttime, or indoor ambient light conditions. Other examples include attachments to a helmet visor or goggle apparatus for viewing of surroundings during a plurality of lighting conditions. Yet other examples include enhancements to a windscreen or head-up display (HUD) in vehicles and aircraft operated in a variety of lighting conditions. Still other examples include additions or improvements to industrial, security, gaming products, sport, recreational and medical (e.g., surgical or diagnostic) imaging systems.

The present disclosure also provides methods for creating the present detectors and imaging systems and methods for reading out the signals generated by the detectors and imagers. Physical co-location of two or more detector devices in a single pixel is possible to detect respective two or more portions of the electromagnetic spectrum incident on said single pixel. The two or more devices can be switchable to enable one or more of said portions to generate a readable output therefrom.

Some specific embodiments are directed to a radiation-detecting apparatus for detecting a plurality of wavelengths of the electromagnetic spectrum, comprising a semiconducting substrate; and a laser-treated cantilevered detector element, having at least a portion thereof being laser-treated, and coupled proximal to a first end thereof to said substrate, and having a second end thereof disposed above said substrate and separated therefrom; said laser-treated portion including laser-enhanced structure and doping composition to cause said portion to be responsive to a range of the electromagnetic spectrum.

Other specific embodiments are directed to a method for determining a quantity of electromagnetic radiation incident at a pixel location, comprising treating at least a portion of a semiconductor detector element with a short-pulse laser so as to create at least a laser-treated portion therein; mechanically coupling at least one part of said laser-treated detector element to a substrate; mechanically disposing another part of said laser treated detector above said substrate; and electrically coupling a connection point on said laser-treated detector element to another contact point in a circuit to generate an output signal that is indicative of a quantity of said electromagnetic radiation incident at said pixel location.

Yet other specific embodiments are directed to an apparatus for detecting electromagnetic radiation, comprising a substrate; a first detector element having at least a fixed portion thereof coupled to said substrate, and having a raised portion thereof disposed over and separated from said substrate; and a second detector element having at least a fixed portion thereof coupled to said fixed portion of said first detector element, and a second portion of said second detector element disposed over said raised portion of said first detector element; said second portion of said second detector element comprising at least a portion thereof that includes laser-treated structure and doping composition to cause said laser-treated portion to be responsive to a range of said incident electromagnetic spectrum.

Still other specific embodiments are directed to a multi-wavelength detector pixel for detecting at least two portions of the electromagnetic spectrum that are incident upon a same area of said apparatus exposed to said electromagnetic spectrum, comprising a first micro-bolometer detector arrangement comprising a temperature-sensitive resistive laser-treated portion that is especially responsive to a first portion of said spectrum, and which provides a first output indicative of a quantity of incident radiation in said first portion of said spectrum; and a second micro-bolometer detector arrangement comprising a semiconductor diodic arrangement that is sensitive to a second portion of said spectrum and which provides a second output indicative of a quantity of incident radiation in said second portion of said spectrum; said first and second micro-bolometer detector arrangements being substantially exposed to said incident spectrum to enable simultaneous detection of both portions of said electromagnetic spectrum at a location of said pixel.

Other uses for the methods and apparatus given herein can be developed by those skilled in the art upon comprehending the present disclosure.

V. BRIEF DESCRIPTION OF THE DRAWINGS

For a fuller understanding of the nature and advantages of the present invention, reference is be made to the following detailed description of preferred embodiments and in connection with the accompanying drawings, in which:

FIG. 4 illustrates yet another example of a raised 'bridge' detector pixel;

VI. DETAILED DESCRIPTION

As alluded to above, the present disclosure describes systems and articles of manufacture for providing wide-band imagers and methods for making and using the same. These methods and apparatus are useful in many applications, including applications benefiting from imaging in a variety of light conditions and including night/day imaging. Also, these methods and apparatus can improve imaging through some aerosol obscurations. In some embodiments the imagers and techniques provided herein can be adapted to small, inexpensive, low-power, portable applications such as hand carried, helmet-mounted and similar applications. In-vehicle and in the field uses are described and will be apparent to those skilled in the an upon reviewing the present disclosure.

Some or all embodiments hereof include a sensor or detector sensitive to certain electromagnetic wavelengths and formed into a MEMS device on a semiconductor substrate. In some embodiments, the MEMS detector includes a portion comprising a semiconductor material, for example silicon, which is irradiated by a short pulse laser to create modified micro-structured surface morphology. The laser processing can be the same or similar to that described in U.S. Pat. No. 7,057,256. The laser-processed semiconductor is made to have advantageous light-absorbing properties. In some cases this type of material has been called "black silicon" due to its visually darkened appearance after the laser processing and because of its enhanced absorption of light and IR radiation compared to other forms of silicon.

Generally, the wavelength of the irradiating laser pulse, its fluence, and pulse width can affect the morphology of the microstructured surface. In some embodiments, the laser fluence is preferably selected to be between about 1.5 kJ/m$^2$ and 12 kJ/m$^2$, but may vary depending on the substrate composition. The choice of the fluence of laser pulses irradiating a silicon wafer to generate a microstructured layer therein can also affect the gettering performance (capacity and/or specificity) of a microstructured substrate. In general in various embodiments of the invention, the laser pulse fluence is selected to be greater than about 3 kJ/m$^2$. More preferably, the fluence is chosen to be in a range of about 3 kJ/m$^2$ to about 10 kJ/m$^2$, or a range of about 3 kJ/m$^2$ to about 8 kJ/m$^2$.

Additionally, the laser pulse length can affect the morphology and absorption properties of the treated silicon. Irradiation of a substrate according to the invention can be with femtosecond laser pulses or picosecond or nanosecond pulses. Other factors that can affect microstructures morphology include laser polarization and laser propagation direction relate to the irradiated silicon surface.

In some embodiments, the laser micro structuring of a substrate is performed in the presence of a mixture of two or more substances where needed to accomplish the present purposes. For example, silicon samples treated in the presence of a mixture of $SF_6$ and $Cl_2$ exhibit an increase in the microstructure density at higher partial pressure of $SF_6$.

Figure 1:
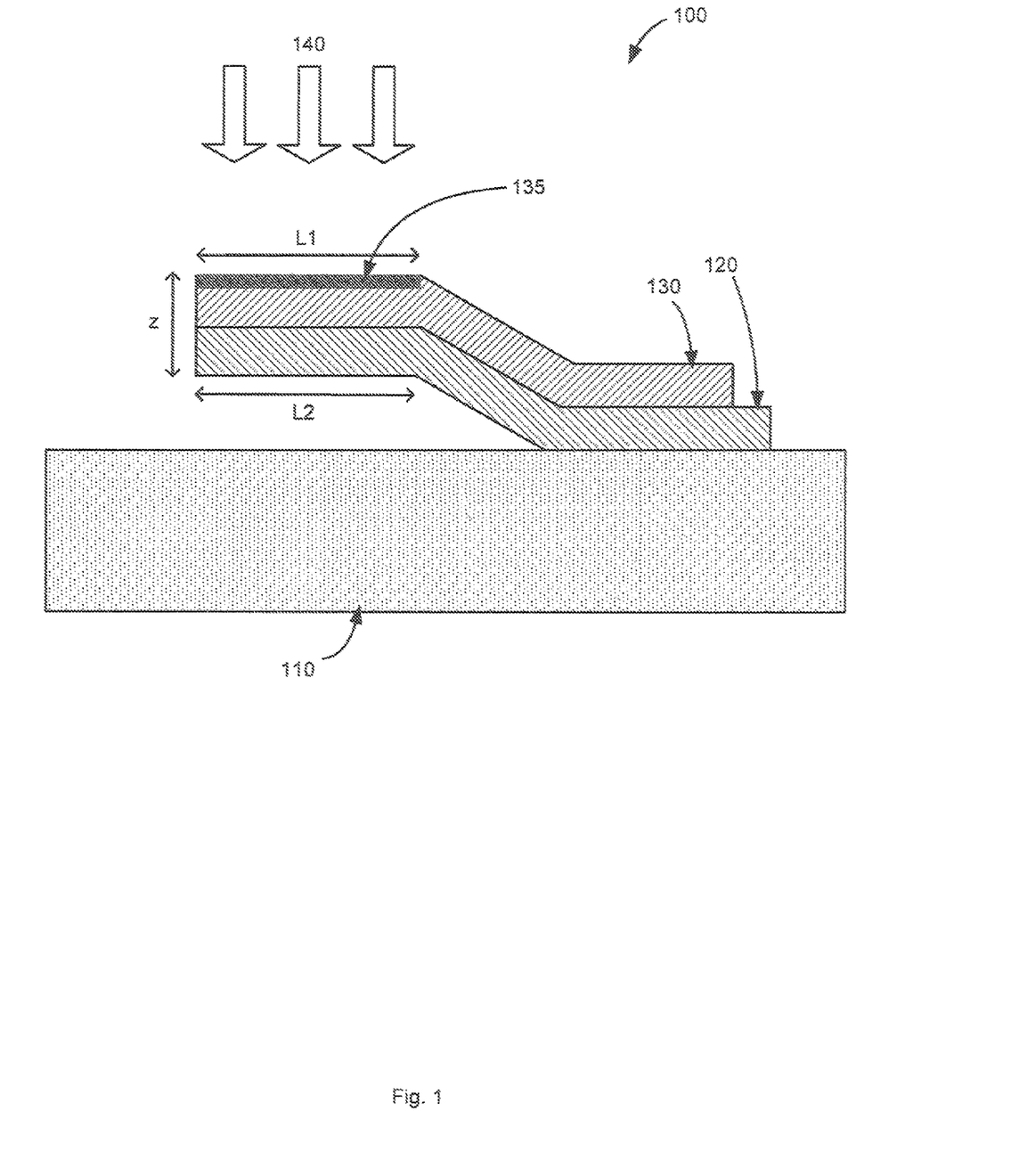
FIG. 1 illustrates an exemplary cantilevered detector pixel.

We now turn to a description of an exemplary apparatus for detecting electromagnetic radiation or light in at least a range of wavelengths of the electromagnetic spectrum. FIG. 1 illustrate a detector 100 arranged on a substrate 110 for enhanced detection of an IR range of wavelengths and responsive to such incident radiation 140. Detector 110 includes a first cantilevered element 120 constructed upon substrate 110 or proximal thereto in a cantilevered arrangement as shown. A second cantilevered element 130 is made of a similar or different material than first cantilevered element 120 and is disposed on or proximal to first cantilevered element 120. It should be appreciated that both elements 120 and 130 are being referred to as "cantilevered" because they generally have an end thereof fixed to substrate 110 (directly or indirectly) and another end thereof substantially free and disposed above the substrate 110, even though the first and second cantilevered elements may be attached to each other and not necessarily free from one another. Other mechanical configurations of cantilevered elements 120 and 130 are possible as well.

In the exemplary arrangement of FIG. 1, the two cantilevered elements 120, 130 have fixed ends substantially coupled to substrate 110 and opposite ends that are suspended above and spatially separated from the fixed ends. The raised or suspended ends of cantilevered elements 120, 130 are designed and arranged to allow movement thereof relative to the substrate 110 and the fixed ends of the cantilevered elements. Movement of the free, raised, or non-fixed ends of cantilevered elements 120, 130 is generally along a vertical direction "z" or more precisely along an are defined by the forces acting on the non-fixed portions of cantilevered elements 120, 130 as will be explained below.

By design, a portion of second cantilevered element 130 is laser-treated as described above, to create a treated portion 135 that has a heightened sensitivity to at least a range of wavelengths of incident radiation 140. In some contexts, the laser-treated portion 135 comprises 'black silicon' as has become understood and referenced herein. The treated portion 135 of second cantilevered element 130 is exposed to radiation 140 such that it absorbs or responds to radiation 140, and specifically responds to longer wavelength radiation incident thereon.

In some embodiments, the absorption of radiation 140 and response by the cantilevered element 130, and specifically laser-treated portion 135, causes a dimensional change in cantilevered element 130 or portion 135. For example, a length "L1" of portion 135 is caused to increase as a result of portion 135 absorbing some or all of incident radiation 140. It can be seen that if the cantilevered elements are adhered or mechanically coupled to one another, any dimensional change in the length "L1" of the second cantilevered element 130 with respect to length "L2" of the first cantilevered element 120 will cause a torque that will deflect the non-fixed ends of the cantilevered elements generally in vertical direction "z." Therefore, a properly calibrated detector 100 will permit measurement of an attribute of incident radiation 140 by observation of the deflection in "z" of the non-fixed ends of the cantilevered elements 120, 130. An expansion of 135 (increase in "L1" relative to "L2") will cause a downward deflection in direction "z" toward the surface of substrate 110. A contraction of 135 (decrease in "L1" relative to "L2" will cause an upward deflection in direction "z" away from the surface of substrate 110.

The measurement of the deflection "z" can be made mechanically as a measure of displacement, or can be calculated by another electrical change or a suitable electro-mechanical change of some property of detector 100. Other parameters of detector 100 that can provide a measurement or readout signal include a change in resistance of one or more of the elements of detector 100 as a function of absorption of rays 140, a change with respect to a reference voltage as a function of incident rays 140, a change in capacitance of a portion of detector 100, etc.

It can be appreciated that a plurality of detectors like detector 100 can be arranged, for example in two dimensions along some surface, to give a two-dimensional pixel field indicative of a characteristic (e.g., intensity) of incident radiation 140 along the surface of the surface. An array or grid of detectors 100 can be constructed along (N) rows and (M) columns to yield a M-by-N array. This array of individual detector pixels 100 can now be connected to imaging circuitry to form an image corresponding to the characteristic (e.g., intensity) of incident radiation 140 in two dimensions.

Note that auxiliary features of the detector 100 can be added or modified from that shown in FIG. 1 without substantially departing from the essence of the operation of the device. For example, the detector device 100 can be coupled to readout circuitry that may be electrically connected to the fixed ends of cantilever elements 120, 130, which may in turn be coupled to a greater circuit coupled to each of the detectors in the rows and columns of the imaging device.

Figure 2:
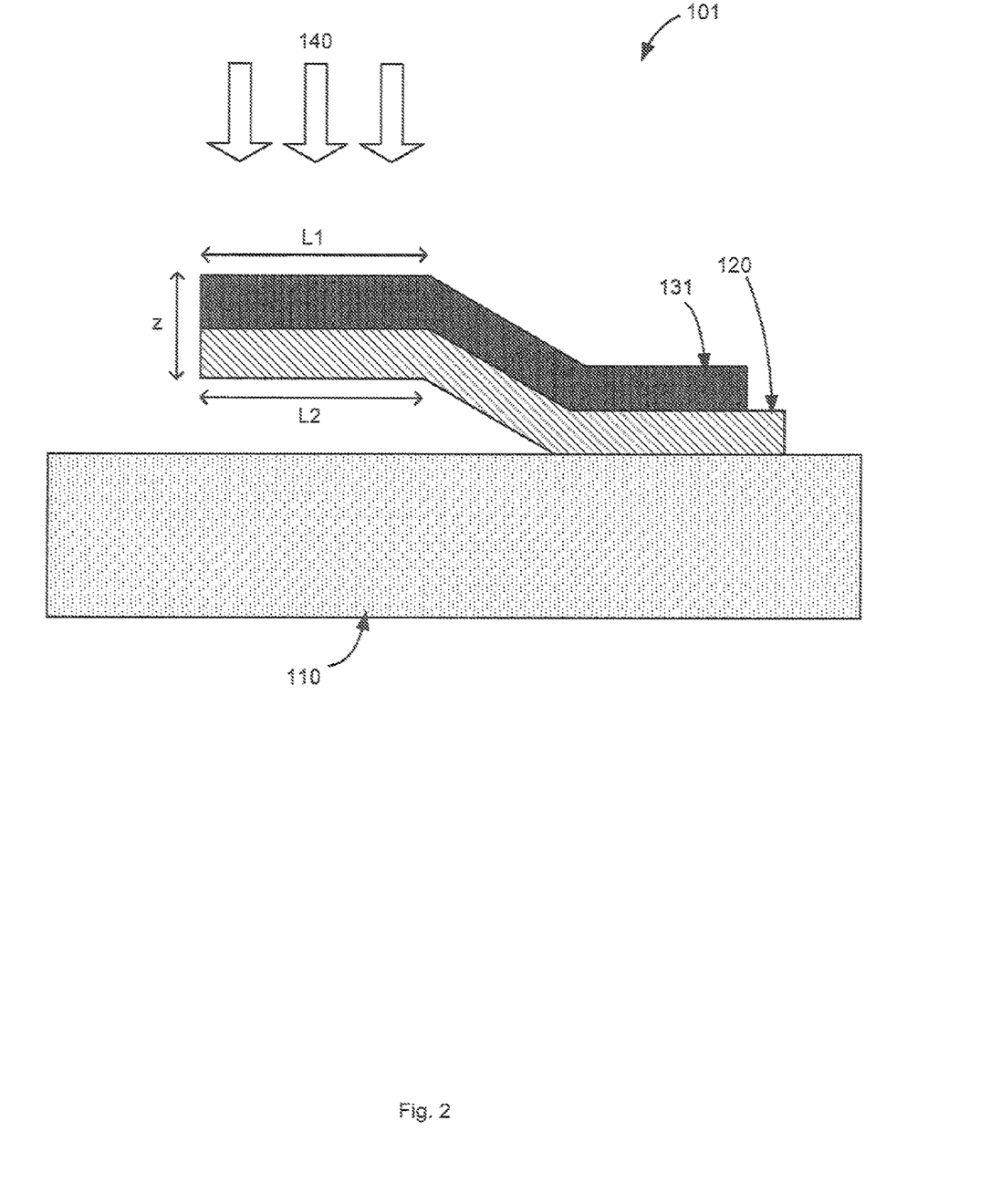
FIG. 2 illustrates another exemplary cantilevered detector pixel.

FIG. 2 illustrates an exemplary embodiment of a wideband microbolometer detector 101 where the entirety (or substantially the entirety) of the second cantilevered detector element 131 comprises a laser-treated semiconductor material such as 'black silicon.' Here, as in the embodiment described above, a relatively increased absorption of some portion of the spectrum of radiation 140 takes place in second cantilevered element 131. This causes a tendency to alter a characteristic of cantilevered element 131 with respect to its characteristic before irradiation with incident light 140. Furthermore, this causes the alteration in said characteristic of element 131 to be manifested because cantilevered detector elements 131 and 120 are coupled to one another, allowing an output mechanical or electrical or electro mechanical signal to be produced that depends on the amount or intensity or spectrum of incident radiation 140. For example, an alteration in the temperature of absorbing laser-treated cantilever element 131 may result in a relative displacement of the non-fixed end thereof with respect to substrate 110. Also, a diodic or resistive output signal between portions of second cantilevered element 131, first cantilevered element 120, and/or substrate 110 can be used as a measurement of a quantitative or qualitative aspect of incident radiation 140. The detector 101 can again in this example be placed into an array of detectors in the context of row/column addressable sensors to create useful outputs and images for static or dynamic imaging systems. Since the pulsed laser treatment of second cantilevered element 131 allows for absorption and detection of a wide range of wavelengths, including LWIR wavelengths, this type of detector can be useful in sensing and measuring features of incident radiation 140, especially broad-spectrum or longer wavelength aspects thereof. As one application, the present detectors 100, 101 may be employed in low-light passive or active imaging sensors and cameras.

Figure 3:
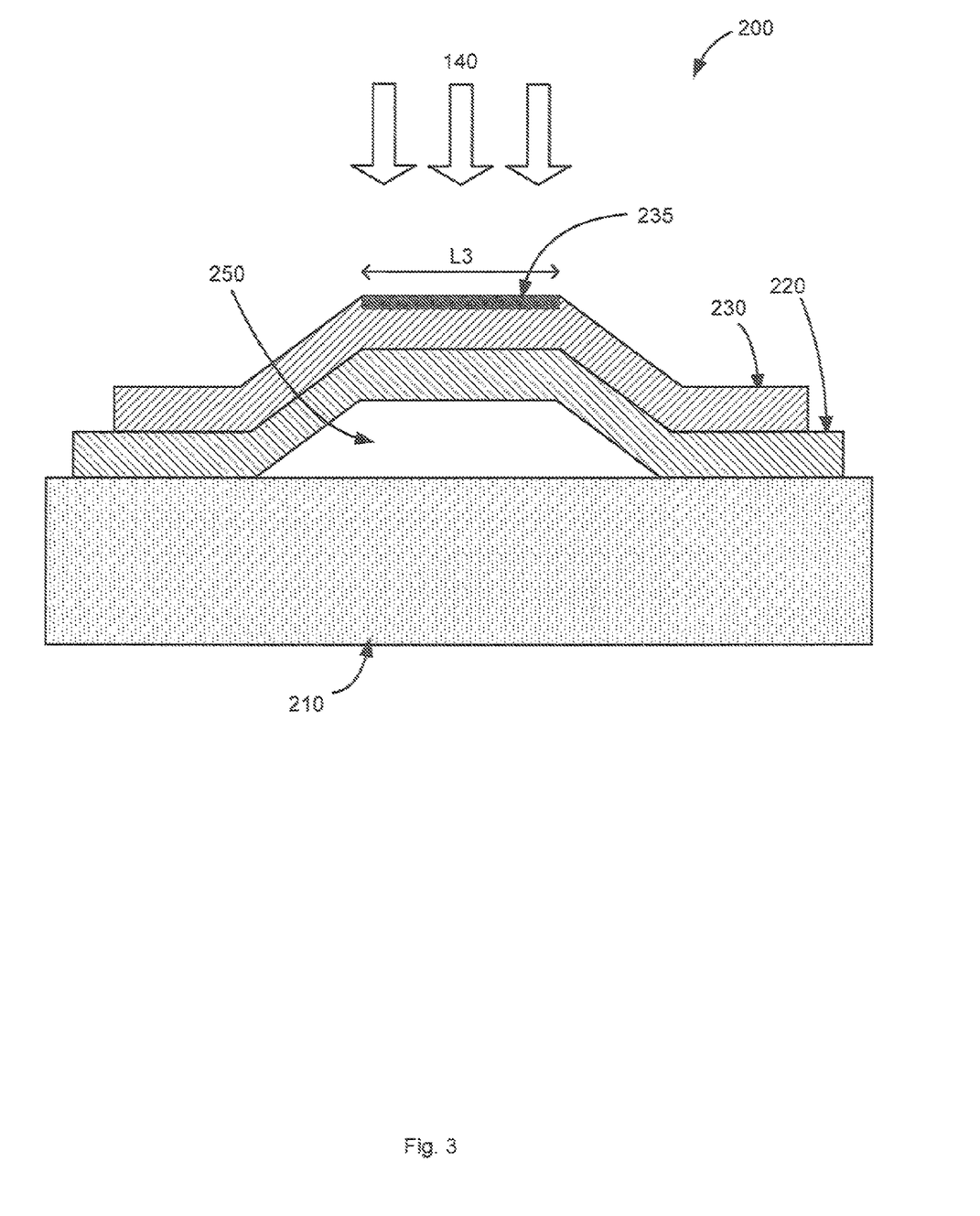
FIG. 3 illustrates an exemplary raised 'bridge' detector pixel.

FIG. 3 illustrates a 'bridge' microbolometer 200 adapted to detect at least a portion of the spectrum of incident electromagnetic radiation 140. A substrate 210 can comprise a semiconducting material, for example silicon, upon which the other components of detector 200 are disposed.

A bridge microbolometer arrangement is constructed or disposed on substrate 210, and includes a first detector element 220 and a second detector element 230. Each of first and second detector elements 220 and 230 have ends thereof that are substantially coupled to or fixed to or proximal to substrate 210 and substantially do not move with respect to substrate 210. It should be understood that two opposing ends of detector elements 220, 230 may be fixed (directly or indirectly) to substrate 210, or more than two opposing ends may be fixed to substrate 210. Each of detector elements 220, 230 also includes a central portion which is raised (like a bridge) or suspended above the surface of substrate 210. It is not necessary that the actual center of the detector elements 220, 230 be raised, but some portion thereof between the fixed ends is so raised above substrate 210. In the exemplary drawing of FIG. 3 the central portions of detector elements 220 and 230 are approximately at the middle of elongated portions 220, 230 and are raised above substrate 210, forming a cavity or opening 250. Cavity or opening 250 can be completely enclosed in three dimensions or can have openings as dictated by a particular design.

Detector element 230 has a portion thereof 235 which is laser-treated to give it enhanced responsivity to a desired portion of incident radiation 140. For example, a pulsed laser treatment of detector element 230 creates a treated portion 235, which may be 'black silicon,' that is relatively responsive to incident LWIR radiation in 140.

A diode or capacitor or resistance bridge or voltage divider circuit can be coupled to the components of detector 200 to allow a readout indicative of the intensity of incident radiation 140 or indicative of another characteristic of incident radiation 140. For example, a voltage can be measured between the ends of detector elements 220, 230, and a comparison between the voltage and a reference voltage would indicate a condition of the microbolometer in response to its absorption of radiation 140. In another example, a diodic circuit element can be set up between the detector elements 220 and 230, again indicative of a condition of said microbolometer 200 under radiation 140. Also, a resistance bridge can be set up that employs a resistance of element 230 or a portion thereof to determine a condition of microbolometer 210. In some embodiments, the resistance of element 230 is affected or dictated by a temperature of element 230, which in turn provides is a function of incident radiation 140. Any such electrical output signal can be combined with others from other detectors 200 acting as individual pixels in a grid or array of detectors 200 like the ones discussed above.

As discussed above, such an array or two dimensional grid of pixel detectors 200 can be used to create an imaging apparatus that provides an image representation of the incident radiation 240 impinging on the row and column pixels of the imager. A suitable readout circuit can create the image representation, which can be still (snapshot) frame or morning (dynamic) time-sequenced. The output of the imager can be recorded to a recording device such as a disk or tape, or can be displayed in real time to a user on a screen, or can be transmitted for remote processing or storage elsewhere.

In further embodiments, a first range of wavelengths of the electromagnetic spectrum are sensed by a first set of elements of the detector pixel and a second range of wavelengths of the electromagnetic spectrum are sensed by a second set of elements of the detector pixel. For example, LWIR radiation can be detected by a temperature-dependent resistance measured across second detector element 230, while SWIR and/or visible radiation is detected by a diodic response sensed between first and second detector elements 220 and 230.

Figure 4:
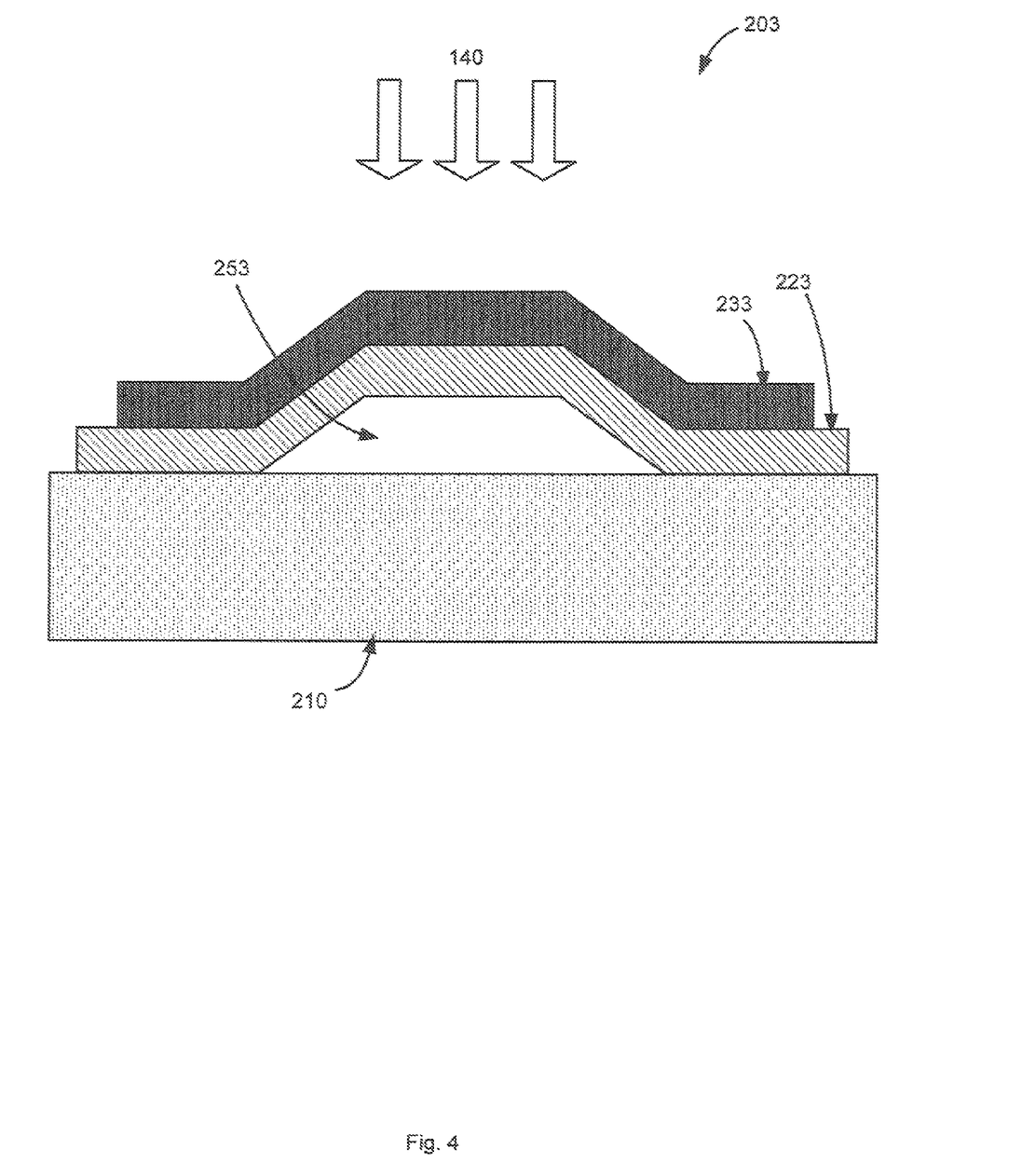
FIG. 4 illustrates another example of a raised 'bridge' detector pixel.

FIG. 4 illustrates an exemplary embodiment of a detector pixel 203 in the form of a bridge microbolometer design and disposed on a substrate 210. The detector pixel 203 is subjected to incident radiation 140 as described earlier. First detector element 223 includes a semiconducting material such as silicon, which second detector element 233 is entirely or substantially entirely made of laser-treated semiconductor material, e.g., 'black silicon.'

Figure 5:
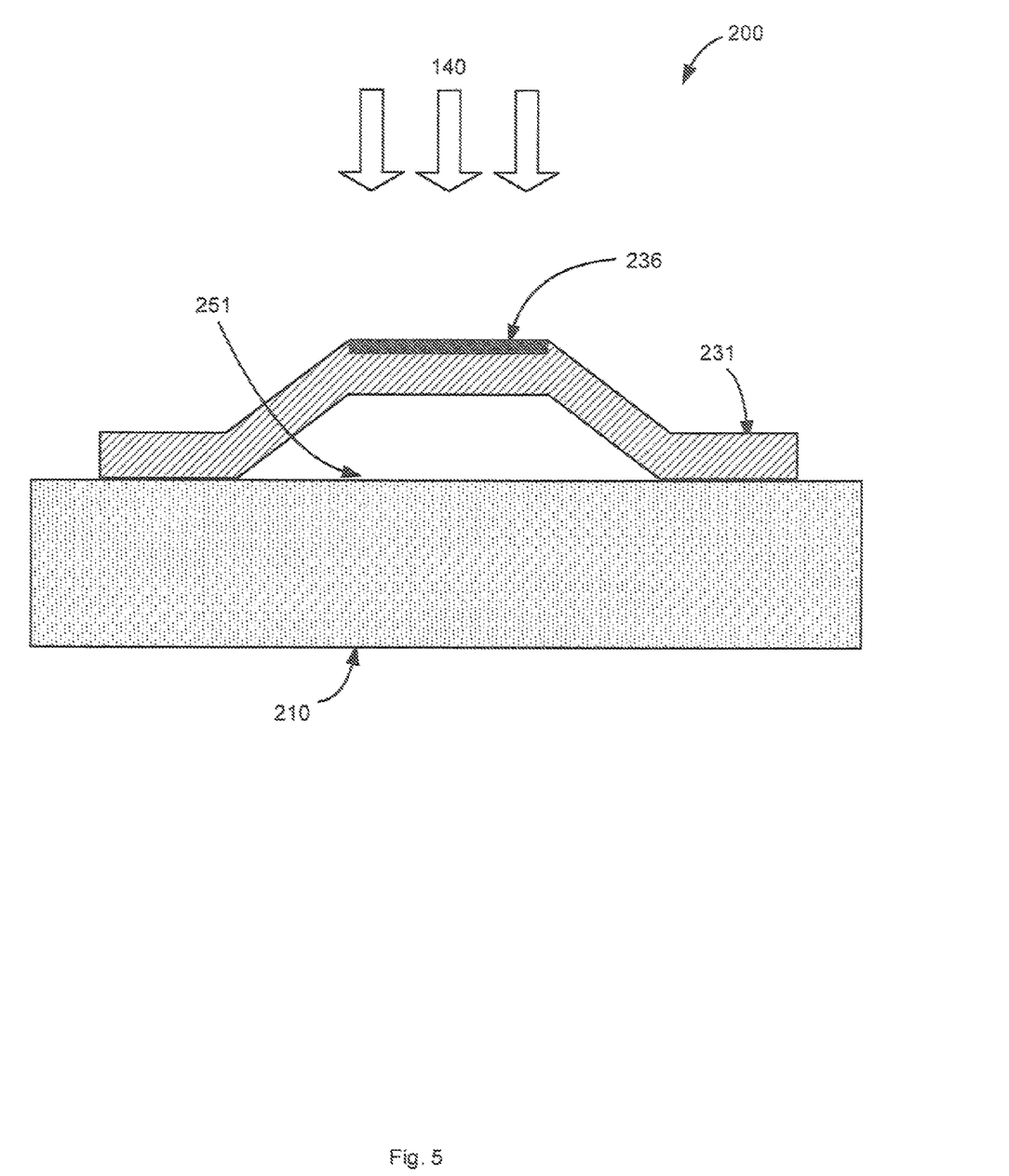

FIG. 5 illustrates another embodiment of a microbolometer detector 201 constructed on a semiconducting substrate 210 and subjected to incident radiation 140. In this embodiment, there is only one bridged semiconductor detector element 231 in use. The ends of said detector element 231 are fixed (directly or indirectly) to substrate 210. A central portion of detector element 231 is raised above substrate 210. A portion of detector element 231 includes a laser-treated section 236 that is sensitive to a range of wavelengths in the electromagnetic spectrum, for example the LWIR range or others. In some embodiments, portion 236 comprises 'black silicon.' A readout signal can be obtained by proper measurement of a capacitance, displacement, voltage, temperature, or resistance in or relative to detector element 231 or portion 236 similar to that discussed earlier, thereby providing a readout signal for a detector 201 or array of detectors 201 in a pixel configuration.

Figure 6:
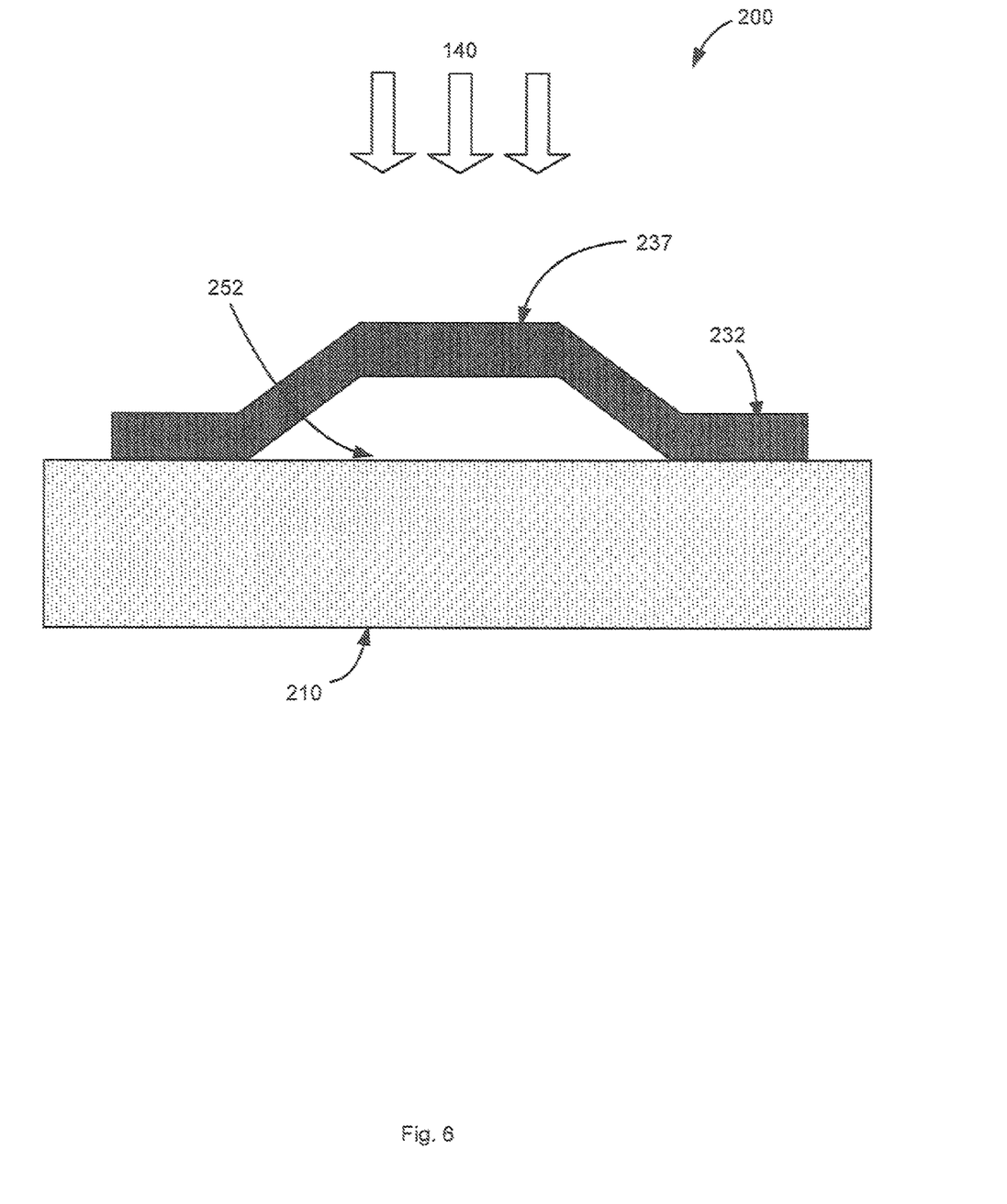
FIG. 6 illustrates a 'bridge' detector pixel using a single laser treated detector element.

FIG. 6 illustrates an exemplary embodiment of a microbolometer detector pixel 202 disposed on a substrate 210 and subject to incident radiation 240 as described above. A bridged, raised, or elevated detector element 232 is entirely or substantially entirely comprised of a laser-treated semiconductor material, e.g., 'black silicon,' or similar material. The laser-treated material in detector element 232 absorbs or responds to a range of wavelengths in incident radiation 140 such as to provide a measurable change in a dimension, position, shape, capacitance, voltage, temperature, or resistance, or other characteristic of detector element 237. This can provide an output to a readout circuit coupled to detector pixel 202 or an array of such pixels. In some embodiments, incident radiation 140, or a LWIR or other longer-wavelength portion thereof, causes a rise in temperature in detector element 237, which in turn causes a change in resistance of element 237. This can be the basis for an electrical output signal from detector 202 that is indicative of radiation 140 or a range of wavelengths within radiation 140.

We now turn to a discussion of the underlying operation of some exemplary embodiments of the present detectors. In each of the examples described, a pulsed laser treated semiconductor (e.g., silicon or other suitable material) is used to enhance the responsiveness of the detector to an desired range of wavelengths of the electromagnetic spectrum, e.g., the IR range, SWIR, or the LWIR. In a specific example, treatment of the silicon portion of the detectors using a femtosecond pulsed laser in the presence of a high concentration of sulfur dopant can provide a good layer of treated silicon for absorbing LWIR and other IR radiation.

The operation of the laser-treated portions and its relevance to the operation of the present detectors is for example in some embodiments related to the resistance of the surface resistors formed by the treated portions. These portions of the detectors can have electrical connections (not shown) placed along their lengths at specified intervals or where practical to allow a readout of the resistance of the laser-treated portions in the presence of incident radiation. Further description of the electrical readout capabilities and exemplary designs for connecting the detectors are given below.

In some embodiments, the present substrates need not be electrically connected to other components of the detectors. As will be further discussed herein, a voltage may be connected to terminals of the detector elements and the resistance across the elements is monitored by measuring the corresponding current through the elements. A small current can be applied in some embodiments through the detector elements to keep self heating to a minimum. Ohm's law provides that the voltage across the elements is generally the product of the resistance times the current in the elements. Therefore, if the relationship between the intensity of the incident radiation and the resistance of the bolometer detector elements is known, a calibration and measurement of the intensity of the incident radiation or portions thereof can be calculated for each imaging pixel element. In the detector elements, the resistance per unit length is related to the temperature in the material of the elements by the thermal coefficient of resistance ("TCR"), given by:

$$TCR=((R1-Ro)/(T1-To))*(1/Ro) \text{ as a percent per degree Kelvin, or}$$

$$TCR=((R1-Ro)/(T1-To))*(10^{\wedge}6) \text{ as ppm per degree Kelvin.}$$

Figure 7:
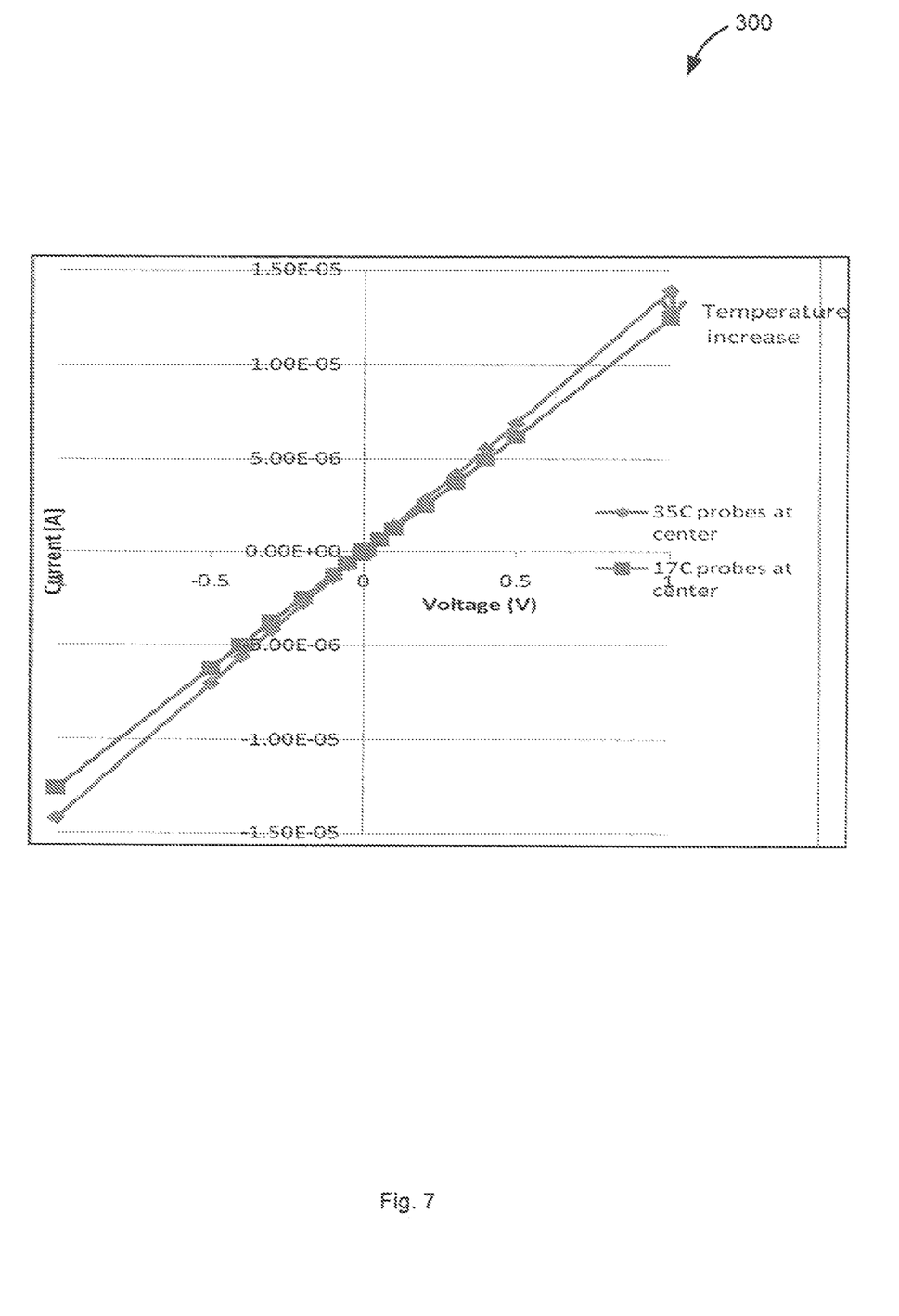
FIG. 7 illustrates an exemplary current-voltage characteristic of a laser-treated detector element.

FIG. 7 illustrates a set of exemplary current (I) versus voltage (V) curves, also known as characteristics 300 for a laser treated material. These curves show a sensitivity to thermal changes that exceeds presently used bolometer material sensitivities. The figure shows a generally linear relationship between current and voltage.

Because of the above characteristic, reading out electrical signals from the microbolometer constructed therefrom will be simplified and useful. A direct current (DC) measurement or a pulsed interrogation measurement can obtain the current through the detector elements with a known voltage applied across the same. The resistance would correspond to the voltage divided by the current as given by Ohm's law.

Figure 8:
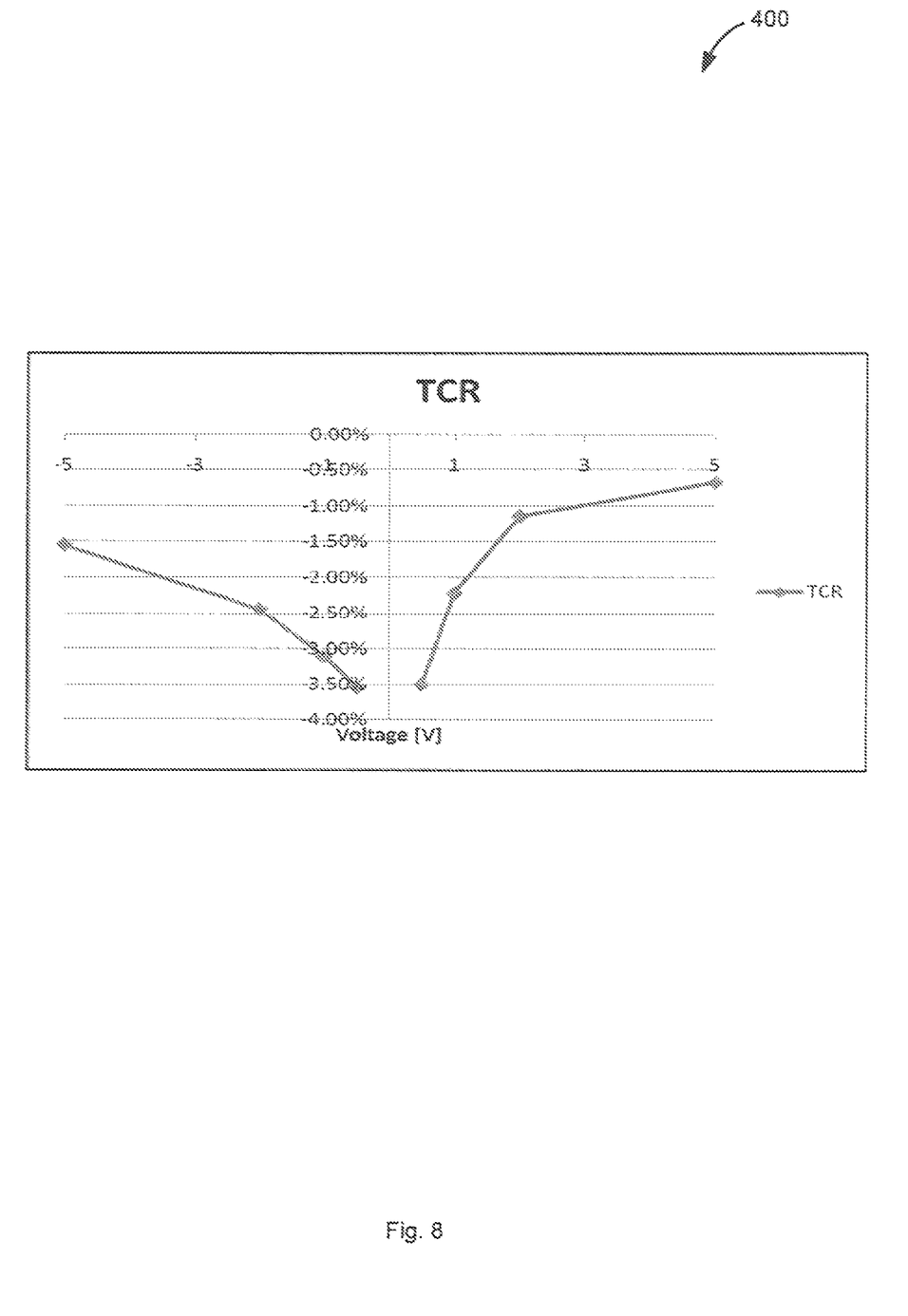
FIG. 8 illustrates an exemplary temperature coefficient of resistance of a laser-treated detector element.

FIG. 8 illustrates a set of exemplary values of TCR 400 for a laser treated material, and supports the use of these materials and others designed with equivalent or comparable or qualitatively similar responses in the present embodiments of microbolometer detector pixels.

The characteristic and TCR curves of FIGS. 7 and 8 show sensitivity to thermal changes exceeding that of the materials commonly used to make bolometers in the prior art. A thin article of manufacture can therefore be made using the laser treated silicon detector elements because of their relatively high absorption coefficients. This absorption property extends from the visible through the IR range, and covers at least the LWIR and in some cases others, e.g., SWIR wavelengths.

In some embodiments, to ensure capture of longer (e.g., LWIR) wavelengths, a quarter-wavelength reflector can be placed below the microbolometer devices described above to increase absorption and sensitivity in the devices at these wavelengths and minimize loss of radiation. Absorbed visible light through SWIR wavelength radiation can be captured with acceptable sensitivity in the laser-treated silicon elements by using a thin junction with the laser treated material. The resulting voltage is integrated either on the junction or in a local storage area in the substrate.

Figure 9:
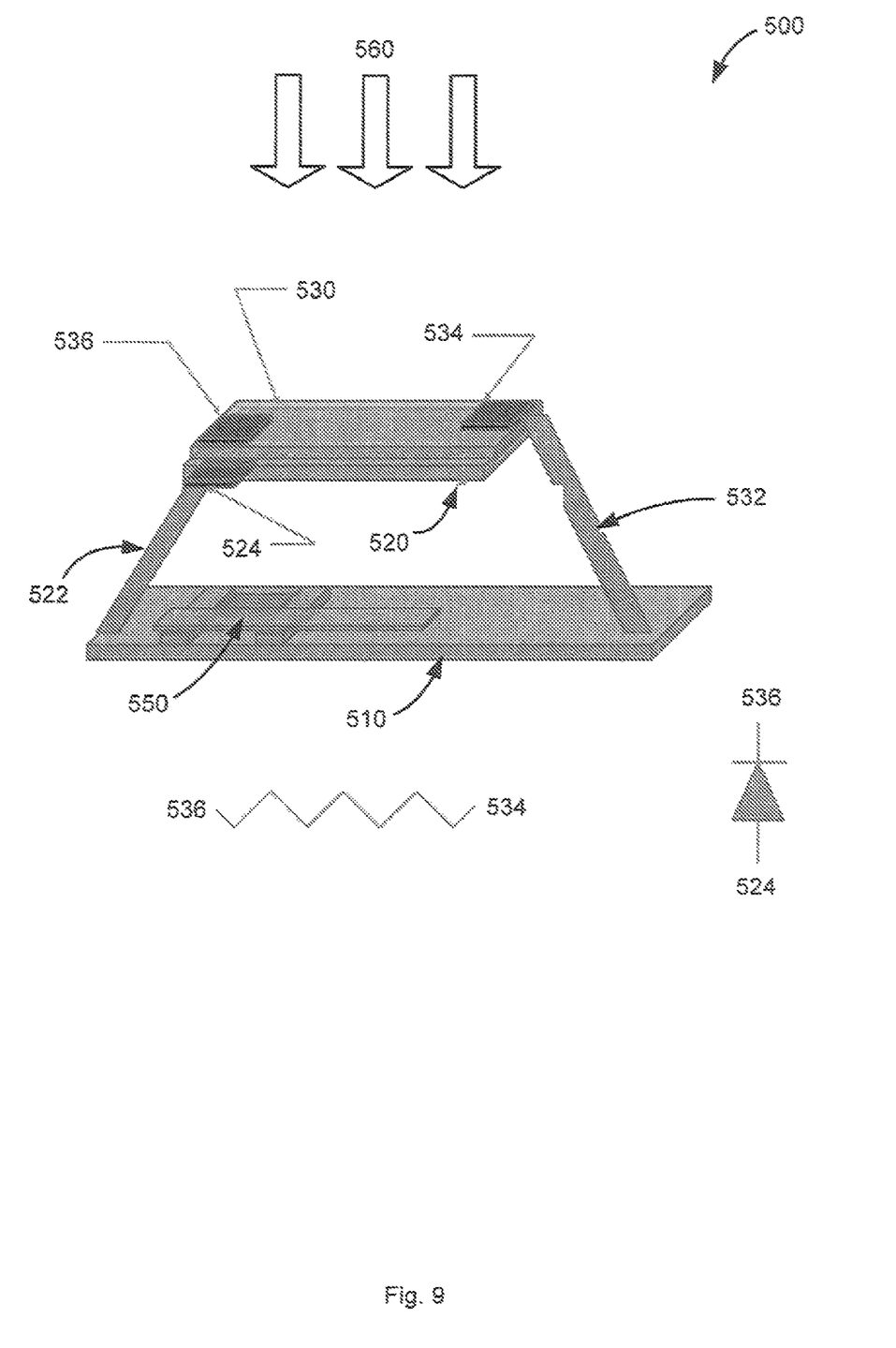
FIG. 9 illustrates an exemplary circuit and detector element arrangement for exemplary embodiments hereof.

FIG. 9 illustrates an exemplary and simplified representation of a microbolometer according to some of the present embodiments. The microbolometer detector 500 shares some or several of the attributes of the "bridge" design detectors discussed earlier (e.g., in FIGS. 3-5). The perspective view of FIG. 9 shows a simplified microbolometer detector 500 supported on a substrate 510 such as a silicon based substrate. The substrate 510 includes one or mote circuits 550 for reading out a signal from detector 50.

A first detector element 520, which may be silicon, is supported by and mechanically coupled to substrate 510 by a first support member 522. A second detector element 530, which may be laser-treated or laser-doped silicon (e.g., 'black silicon'), is partially or wholly treated by the pulsed laser process described earlier and has the advantageous absorption properties of laser-doped semiconductors. Second detector element 530 is supported by and coupled to substrate 510 by a second support member 532. Both first and second support members 522 and 532 are designed to be substantially electrically conductive but substantially thermally isolating. Contacts 524, 534, and 536 electrically and/or electro-mechanically couple the respective detector elements they support.

In operation, the microbolometer 500 acts as a wide-band pixel detector for the ranges of wavelengths absorbed in its detector elements, 520, 530, and notably in laser-treated second detector element 530. The resulting electrical behavior of the system corresponds to a resistance element between contact 536 and contact 534 and/or a diode element disposed between contact 524 and contact 536. Current flow through the above contacts will be indicative of an intensity of incident and detected radiation 560.

The charge from the diode junction 524-526 corresponds to a change in the conductance of the element and may be combined with a thermal signal as a net change in resistance. This wide spectral signal can be integrated and read out in a single channel.

Also, the thermal resistance and the junction charge integration can be read out as two separate signals. Preferably, the charge generated by the junction is not read out via the thermal resistance measurement to avoid crosstalk. Thermal resistance changes will alter the equivalent circuit of the diode which is manifested as a series resistance change. Charge integrated in the junction can be minimized to be read out as resistance data via circuit design. In some embodiments, temporally separating or using a pulsed readout of different bands is possible. Alternatively a readout may be achieved by spatial and/or spectral filtering.

Absorbed visible through SWIR radiation can be captured at high sensitivity by employing a thin junction with the laser-treated material. This voltage is integrated either on the junction or in a local storage area in the substrate 510.

Figure 10:
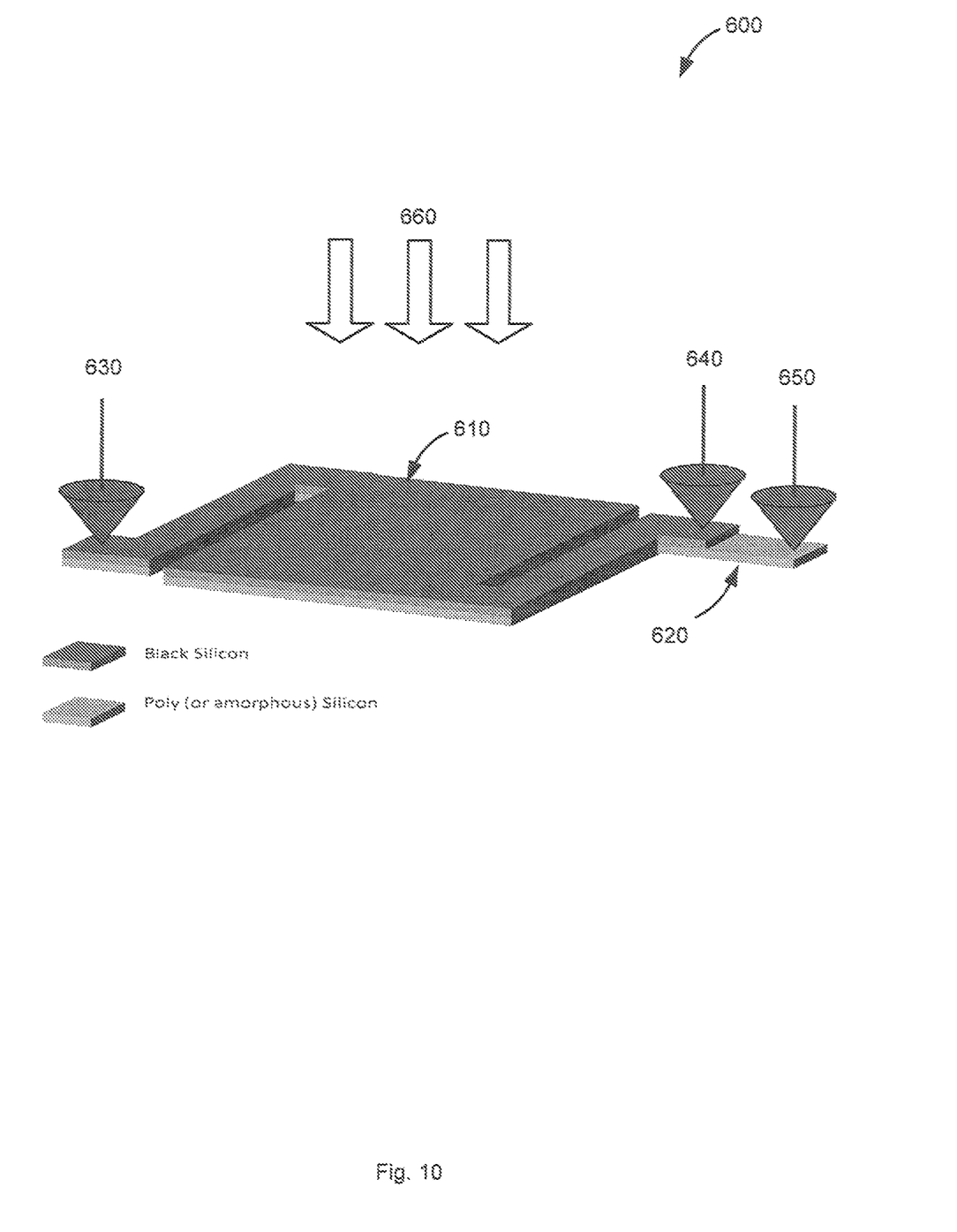
FIG. 10 illustrates an exemplary bolometer arrangement and connection points.

FIG. 10 illustrates a simplified perspective illustration of a detector 600 according to one or more embodiments hereof. This embodiment could be compared to that of FIG. 4. The geometrical layout of the detector 600 is such that a laser-doped detector element 610 is disposed upon a second detector element 620. At least a portion of detector 600 is exposed to radiation 660 which experiences significant absorption in laser-treated detector element 610 in at least some portion of the electromagnetic spectrum. A connection arrangement includes for example three connections 630, 640, and 650 with connections 630 and 640 coupled to the first, or laser-doped, detector element 610, and connection 650 coupled to the second detector element 620. Output and readout circuitry as described above for example can be used to read the signal from detector 600 indicative of the intensity of incident radiation 660.

Figure 11:
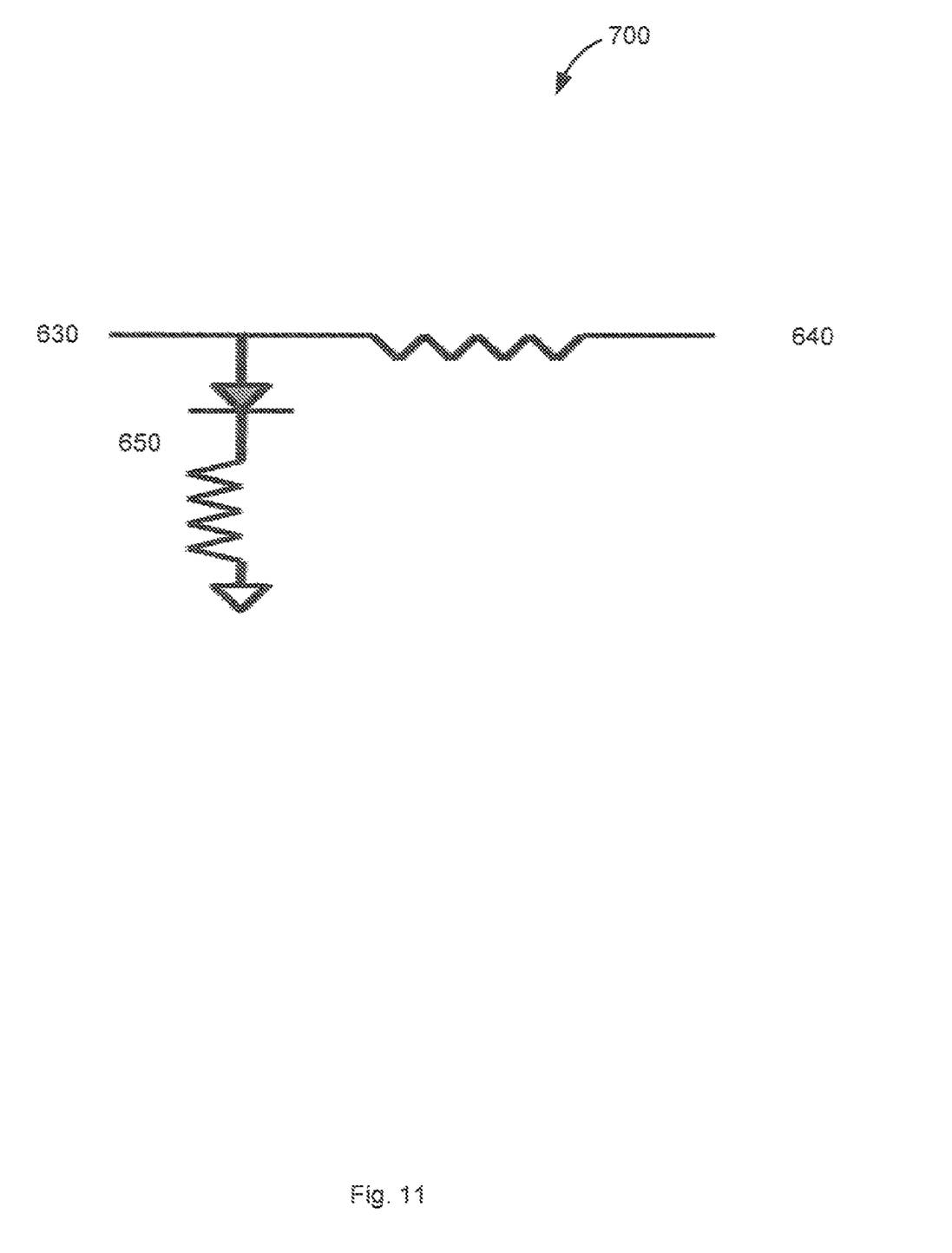
FIG. 11 illustrates an exemplary equivalent circuit for the bolometer detector of FIG. 10.

FIG. 11 illustrates an exemplary equivalent circuit 700 for the microbolometer detector of FIG. 10 having an integrated semiconductor photodetector. Connection points 630, 640, and 650 are indicated thereon, with resistive and capacitive attributes resulting therefrom.

Another feature of the present embodiments that facilitates its use in practical applications is that the present laser treated silicon is compatible with most standard CMOS readout circuit substrates, and can leverage known silicon MEMS and amorphous silicon MEMS technologies such as silicon MEMS cantilever technology.

The present invention should not be considered limited to the particular embodiments described above, but rather should be understood to cover all aspects of the invention as fairly set out in the attached claims. Various modifications, equivalent processes, as well as numerous structures to which the present invention may be applicable, will be readily apparent to those skilled in the art to which the present invention is directed upon review of the present disclosure. The claims are intended to cover such modifications.

We claim:

1. A method for determining a quantity of electromagnetic radiation incident at a pixel location, comprising:

treating at least a portion of a semiconductor detector element with a short-pulse laser so as to create at least a laser-treated portion therein;

mechanically coupling at least one part of said laser-treated detector element to a substrate;

mechanically disposing another part of said laser-treated detector above said substrate; and electrically coupling a connection point on said laser-treated detector element to another contact point in a circuit to generate an output signal that is indicative of a quantity of said electromagnetic radiation incident at said pixel location.

2. The method of claim 1, further comprising coupling said output signal to a readout circuit as part of an array of detector pixels to obtain an image including output signals from a plurality of similar detector pixels.

3. An apparatus for detecting electromagnetic radiation, comprising:

a substrate;

a first detector element having at least a fixed portion thereof coupled to said substrate, and having a raised portion thereof disposed over and separated from said substrate;

said first detector element having a third portion thereof, substantially at an opposite end than said first portion of said first detector element, said third portion of said first detector element also being fixed to said substrate and defining a cavity substantially bounded by said substrate and said first detector element; and a second detector element having at least a fixed portion thereof coupled to said fixed portion of said first detector element, and a second portion of said second detector element disposed over said raised portion of said first detector element;

said second portion of said second detector element comprising at least a portion thereof that includes laser-treated structure and doping composition to cause said laser-treated portion to be responsive to a range of said incident electromagnetic spectrum.

4. A multi-wavelength detector pixel for detecting at least two portions of the electromagnetic spectrum that are incident upon a same area of said apparatus exposed to said electromagnetic spectrum, comprising:

a first detector arrangement comprising a temperature-sensitive resistive laser-treated portion that is especially responsive to a first portion of said spectrum, and which provides a first output indicative of a quantity of incident radiation in said first portion of said spectrum; and a second detector arrangement comprising a semiconductor diodic arrangement that is sensitive to a second portion of said spectrum and which provides a second output indicative of a quantity of incident radiation in said second portion of said spectrum;

said first and second detector arrangements being substantially exposed to said incident spectrum to enable simultaneous detection of both portions of said electromagnetic spectrum at a location of said pixel.

5. The detector pixel of claim 4, further comprising electrical readout circuitry, including diodic and resistive components thereof, for providing an output signal indicative of said respective quantities of radiation in said respective first and second portions of said electromagnetic spectrum.

6. The detector pixel of claim 4, said first detector comprising a 'black silicon' portion thereof for detecting an infrared portion of said electromagnetic spectrum.

7. The detector pixel of claim 4, said second detector comprising a semiconductor junction for detecting a portion of said electromagnetic spectrum.

* * * * *